United States Patent [19]

Adair et al.

[11] Patent Number: 4,713,312
[45] Date of Patent: Dec. 15, 1987

[54] IMAGING SYSTEM EMPLOYING PHOTOSENSITIVE MICROCAPSULES CONTAINING 3-SUBSTITUTED COUMARINS AND OTHER PHOTOBLEACHABLE SENSITIZERS

[75] Inventors: Paul C. Adair; Gary F. Hillenbrand; Paul D. Davis, all of Chillicothe, Ohio

[73] Assignee: The Mead Corporation, Dayton, Ohio

[21] Appl. No.: 939,270

[22] Filed: Dec. 10, 1986

Related U.S. Application Data

[63] Continuation of Ser. No. 824,310, Jan. 30, 1986, abandoned, Continuation of Ser. No. 658,934, Oct. 9, 1984, abandoned.

[51] Int. Cl.$^4$ .................... G03C 1/40; G03C 1/00
[52] U.S. Cl. .................... 430/138; 427/221; 427/222; 428/402.2; 428/402.21; 428/404.24; 430/394; 430/592
[58] Field of Search .................... 430/502, 138, 394; 427/221, 222; 428/402.2, 402.21, 404.24; 204/159.23

[56] References Cited

U.S. PATENT DOCUMENTS

| | | | |
|---|---|---|---|
| 3,533,797 | 10/1970 | James et al. | 430/343 |
| 4,147,552 | 4/1979 | Specht et al. | 430/285 X |
| 4,268,667 | 5/1981 | Anderson | 430/281 |
| 4,399,209 | 8/1983 | Sanders et al. | 430/138 |
| 4,416,966 | 11/1983 | Sanders et al. | 430/235 X |
| 4,440,846 | 4/1984 | Sanders et al. | 430/211 X |
| 4,578,339 | 3/1986 | Adkins | 430/138 |
| 4,578,891 | 3/1986 | Adair et al. | 430/138 |
| 4,587,194 | 5/1986 | Adair et al. | 430/138 |

*Primary Examiner*—John E. Kittle
*Assistant Examiner*—Mukund J. Sham
*Attorney, Agent, or Firm*—Smith & Schnacke

[57] ABSTRACT

Imaging systems employing photosensitive microcapsules having improved film speed are disclosed wherein the microcapsules contain a photosensitive composition in which the photoinitiator system includes a photobleachable sensitizer such as a 3-substituted coumarin compound; the invention is particularly useful in providing self-contained imaging systems which are sensitive at 390–500 nm but which can be photobleached to reduce background yellow; an imaging process including a photobleaching step following exposure and development is also disclosed.

8 Claims, No Drawings

IMAGING SYSTEM EMPLOYING PHOTOSENSITIVE MICROCAPSULES CONTAINING 3-SUBSTITUTED COUMARINS AND OTHER PHOTOBLEACHABLE SENSITIZERS

This is a continuation of co-pending application Ser. No. 824,310, filed Jan. 30, 1986, now abandoned, which is a continuation of co-pending application Ser. No. 658,934, filed Oct. 9, 1984.

BACKGROUND OF THE INVENTION

The present invention relates to an improved imaging system of the type employing photosensitive microcapsules.

Imaging systems employing photosensitive microcapsules are described in commonly assigned U.S. Pat. Nos. 4,399,209 and 4,440,846 and commonly assigned U.S. applications Ser. No. 339,917 filed Jan. 18, 1982, and Ser. No. 620,994 filed June 15, 1984. The imaging systems, in their simplest form, comprise an imaging sheet having a layer of photosensitive microcapsules coated on one surface. The internal phase of the microcapsules includes a photosensitive composition and, more particularly, a photocurable composition which cures by free radical addition polymerization. In the most typical embodiments, the internal phase also includes an image-forming agent such as a substantially colorless electron donating color former. Images are formed by image-wise exposing the layer of microcapsules to actinic radiation and subjecting the layer to a uniform rupturing force in the presence of a developer material.

U.S. Pat. No. 4,399,209 discloses a transfer imaging system in which the developer material is provided on a support which is separate and distinct from the imaging sheet. After exposing the imaging sheet, it is assembled with the developer sheet and the two are passed together with their reactive faces in contact between a pair of pressure rollers.

U.S. Pat. No. 4,440,846 describes a self-contained system in which the developer is provided on the same surface of the support as the photosensitive microcapsules.

U.S. application Ser. Nos. 339,917 and 620,994 describe full color imaging systems in which three sets of microcapsules respectively containing cyan, magenta and yellow color formers are provided on one or separate supports and image-wise exposed using color separation techniques to provide a full color image. In one embodiment, the three sets of the microcapsules have distinct sensitivities such that they can be mixed and exposed on the surface of a single support using, for example, a Dunn matrix camera.

SUMMARY OF THE INVENTION

Microcapsule formulations which are sensitive in the region of 390 to 500 nm of the visible spectrum are yellow in color due to the spectral sensitivity of the internal phase and, more particularly, the photoinitiator system. While this is not disadvantageous in a transfer imaging system wherein the image is formed on the developer or image-receiving sheet which is separate from the imaging sheet, it is a problem in self-contained systems because the image is formed directly on the imaging sheet. The presence of yellow microcapsules imparts a yellow tint to the background and aesthetically detracts from the image.

In accordance with the present invention, imaging sheets are provided containing a photobleachable sensitizer in the internal phase and, more particularly, a 3-substituted coumarin compound. These sensitizers are sensitive in the 390–500 portion of the spectrum and impart a yellow hue to the imaging sheet but for the fact that they can be bleached upon exposure to fluorescent (ultraviolet) light following development. By incorporating 3-substituted coumarin compounds or other photobleachable 390–500 nm sensitizers in the internal phase of the microcapsules, a self-contained imaging sheet can be provided which, while initially yellow or yellow tinged, can be bleached by exposure to fluorescent light following development to obtain a whiter background and improved image quality.

The use of 3-substituted coumarin compounds as sensitizers in photosensitive microencapsulated imaging systems is important not only because the compounds are photobleachable but also because they improve imaging speed. Thus, it has been found that it is advantageous to use these compounds in both self-contained and transfer imaging systems for improved film speed.

One object of the present invention is to provide an improved self-contained imaging system which includes a photoinitiator system in the internal phase containing a photobleachable sensitizer.

Another object of the present invention is to provide a self-contained imaging system including a photobleachable sensitizer which is sensitive in the range of 390 to 500 nm and which can be photobleached following exposure and development to provide a white or nearly white background.

Still another object of the present invention is to provide an imaging process wherein following exposure and development of a self-contained imaging sheet in accordance with the present invention, the sheet is uniformly exposed to ultraviolet radiation to bleach the sensitizer and whiten the background.

Still another object of the present invention is to provide an imaging system employing photosensitive microcapsules having improved film speed wherein the microcapsules include a 3-substituted coumarin compound as part of the photoinitiator system. This imaging system can be a transfer or self-contained imaging system.

DEFINITIONS

The term "microcapsule" as used herein includes both microcapsules having a discrete capsule wall as well as so-called open phase systems in which the photosensitive composition is dispersed in a binder.

The term "actinic radiation" as used herein includes the full spectrum of electromagnetic radiation as well as x-ray, ion beam, and gamma radiation.

DETAILED DESCRIPTION OF THE INVENTION

The imaging systems of the present invention can be prepared by following the teachings in U.S. Pat. Nos. 4,399,209 and 4,440,846 and U.S. applications Ser. Nos. 339,917 and 620,994 which are incorporated herein by reference.

The present invention is useful in providing a blue light-sensitive imaging sheet having improved film speed and, more particularly, to providing a blue light sensitive self-contained sheet having both improved film speed and improved background color. It is also useful in providing blue light sensitive imaging sheets which are developed by sequentially rupturing the microcapsules and applying a developer composition to the surface of the sheet wherein images are formed on the imaging sheet itself and reduced background yellowing is desired. Full color systems including blue-sensitive microcapsules are also within the scope of the present invention.

While various photobleachable sensitizers sensitive to blue light can be used in the present invention, a particularly useful class of sensitizers is 3-substituted coumarin compounds. Representative examples of 3-substituted coumarin compounds useful in the present invention are described in U.S. Pat. No. 4,147,552 to Eastman Kodak Company and can be represented by the formula (I):

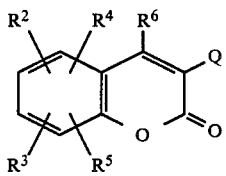

wherein Q is —CN or —Z—R$^1$; Z is carbonyl, sulfonyl, sulfinyl or arylenedicarbonyl; R$^1$ is hydroxy, an alkenyl group having 2 to 12 carbon atoms (e.g., vinyl, styryl, etc); an alkyl group having 1 to 12 carbon atoms (e.g., methyl, ethyl, propyl, amyl, heptyl, etc.); an alkoxy group having 1 to 12 carbon atoms (e.g., methoxy, ethoxy; butoxy, etc.); an aryl group having 6 to 10 nuclear carbon atoms (e.g., phenyl, naphthyl, etc.); a carbocyclic group having 5 to 12 carbon atoms (e.g., cyclohexyl); or a heterocyclic group having 5 to 15 nuclear carbon and hetero atoms (e.g., 3-pyridyl, 4-pyridyl, furyl, thienyl, pyridinium, or coumarinyl);

R$^2$, R$^3$, R$^4$ and R$^5$ each independently represent hydrogen, an alkoxy group having 1 to 6 carbon atoms, a dialkylamino group with each alkyl group having 1 to 4 carbon atoms (e.g., diethylamino), a halogen atom (e.g., chloro, iodo, etc.), an acyloxy group, a nitro group, a 5- or 6-membered heterocyclic group, or a group having the formula (II):

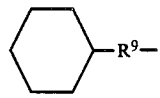

wherein R$^9$ is an alkylene group having from 1 to 5 carbon atoms:

R$^6$ is hydrogen, an alkyl group having from 1 to 4 carbon atoms, an aryl group having 5 to 10 nuclear carbon atoms, or an acyl group having 2 to 6 carbon atoms (e.g., acetyl);

and wherein two or three of R$^2$, R$^3$, R$^4$, and R$^5$ and the nuclear carbon atoms to which they are attached can together form a fused ring or fused ring system, each ring being a 5- or 6-membered ring.

In accordance with the most preferred embodiments of the invention Q is —Z—R$^1$, Z is carbonyl, and R$^1$ is a heterocyclic group, carbocyclic group, or an aryl group.

3-substituted coumarin compounds which are useful in the present invention include:

7-diethylamino-5',7'-dimethoxy-3,3'-carbonylbiscoumarin;
3,3'-carbonylbis(5,7-dimethoxycoumarin);
7-diethylamino-3,3'-carbonylbiscoumarin;
7-diethylamino-7'-methoxy-3,3'-carbonylbiscoumarin;
7-diethylamino-7'-dimethylamino-3,3'-carbonylbiscoumarin;
7-diethylamino-3-thenoylcoumarin;
3-(2-coumariloyl)-7-diethylaminocoumarin;
3-cinnamoyl-7-diethylaminocoumarin;
3[(4-dimethylamino)-cinnamoyl]-7-diethylaminocoumarin.

These compounds can be prepared in accordance with the teachings in U.S. Pat. No. 4,147,552.

Other photobleachable sensitizers include 9,10-phenantherenequinones such as 2-methyl-9,10-phenanthrenequinone and 2-dodecyl-9,10-phenanthrenequinone; camphorquinone and the compounds

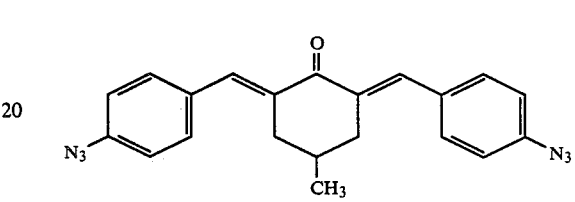

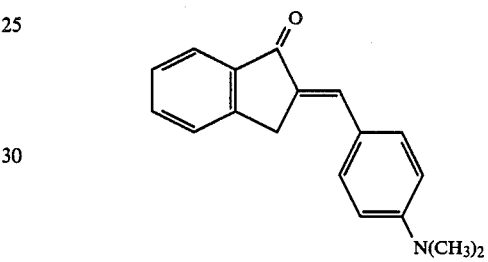

The photobleachable sensitizer can be used alone or in a photoinitiator system including other photoinitiators such as aromatic ketones and diketones, e.g., 2,2-dimethoxy-2-phenylacetophenone (e.g., Irgacure 651 of Ciba-Geigy); 1-hydroxycyclohexyl phenyl ketone (e.g., Irgacure 184 of Ciba-Geigy); 2,2-diethoxyacetophenone; ethyl 4-dimethylaminobenzoate, thioxanthones, xanthones; benzoin alkylethers such as benzoin propyl ether and benzoin isobutyl ether, etc. Preferred photoinitiator systems include co-initiators which function as hydrogen donors. Useful hydrogen donors include tertiary amino compounds and, more particularly, dialkylanilines such as N,N-dimethylanilines (e.g., 2,6,N,N-tetra-methylaniline, 4-t-butyl-N,N-dimethylaniline, etc.).

The amount of sensitizer used in the present invention will vary with the nature of the ethylenically unsaturated compound, the size of the microcapsules and other factors. Generally, in the case of a 3-substituted ketocoumarin compound it is used in an amount of about $3 \times 10^{-6}$ to $6 \times 10^{-4}$ moles per gram of photopolymerizable material.

A preferred example of a photosensitive composition in accordance with the present invention is:

| | |
|---|---|
| Trimethylolpropane triacrylate | 200 parts |
| 3-Cinnamoyl-7-diethylaminocoumarin | 0.4 parts |
| Ethyl-4-dimethylamino benzoate | 8 parts |
| 2,6-Diphenyl-4-(4'-dimethylaminophenyl)pyridine | 20 parts |

With the exception of the inclusion of a photobleachable sensitizer, the microcapsules of the present invention can be prepared as described in the aforementioned patents. In a full color imaging system it is often desirable to additionally incorporate an absorber compound such as an ultraviolet absorber in the internal phase to narrow the spectral sensitivity of the microcapsules. Useful absorbers are described in commonly assigned U.S. application Ser. No. 620,994.

The most common examples of photopolymerizable materials are compounds which are curable by free radical addition polymerization such as ethylenically unsaturated compounds, e.g., compounds containing one or more terminal or pendant vinyl or allylic groups. Such compounds are well known in the art and include acrylic and methacrylic esters of polyhydric alcohols such as trimethylolpropane, pentaerythritol, and the like. Representative examples include ethylene glycol diacrylate, ethylene glycol dimethacrylate, trimethylolpropane triacrylate (TMPTA), pentaerythritol tetraacrylate, pentaerythritol tetramethacrylate, hexanediol-1,6-dimethacrylate, and diethyleneglycol dimethacrylate.

In accordance with one embodiment of the present invention, the radiation sensitive composition may additionally include a polythiol to increase the film speed of the microcapsules. Useful polythiols include ethylene glycol bis(thioglycolate), ethylene glycol bis($\beta$-mercapto-propionate), trimethylolpropane tris(thioglycolate), pentaerythritol tetrakis(thioglycolate) and the most preferred pentaerythritol tetrakis($\beta$-mercaptopropionate) and trimethylolpropane tris($\beta$-mercapto-propionate), and mixtures thereof. These compounds are commercially available. Certain polymeric polythiols such as polypropylene ether glycol bis($\beta$-mercaptopropionate) which is prepared by esterification of polypropylene ether glycol may also be useful.

Various oligomers or polymers can also be used in the present invention to improve the film speed of the microcapsules. These materials should be soluble in the photosensitive composition and not interfere with the photopolymerization reaction. Reactive oligomers contain terminal or pendant ethylenic unsaturation and include urethane, ester and epoxy based reactive acrylate, methacrylate, vinyl and allyl prepolymers. Useful non-reactive oligomers are polymers which are solid or semisolid at room temperature but soluble in the unreacted photosensitive composition. Representative examples of some commercially available oligomers or polymers which are useful in the present invention include reactive materials such as diallyl o-phthalate prepolymer (Polysciences), Uvithane 893 (Morton Thiokol, Inc.), Ebercryl 270 (Virginia Chemicals) and non-reactive materials such as ethyl cellulose, or Lucite.

An image-forming agent is associated with the photosensitive microcapsules of the present invention on the imaging sheet. Preferably, the image-forming agent is present in the internal phase of the microcapsules however, where the unexposed or unreacted internal phase is capable of dissolving or otherwise mobilizing the image-forming agent, it may be outside the capsule, in the same layer as the microcapsules are incorporated or in a layer contiguous with the layer containing the microcapsules.

Various image-forming agents can be used in the present invention including dyes and pigments, however, the most typical and preferred image-former is a chromogenic material such as a substantially colorless electron donating compound of the type used in pressure-sensitive carbonless copy paper. These compounds are well known in the art and react with acidic developers to generate color images. Useful examples include compounds such as those described in U.S. Pat. No. 3,985,376 to BASF.

The color former is incorporated in the internal phase in an amount sufficient to produce a visible image of the desired density upon reaction with a developer or upon transfer. In general, the color former is present in an amount of approximately 0.5 to 20% by weight based on the weight of the internal phase. A preferred range is about 2 to 10% by weight. Transfer imaging materials usually contain about 6% by weight of the color former whereas self-contained materials contain about 1.5 to 3% by weight of the image-forming agent. The relative amounts of the cyan, magenta and yellow color formers in the microcapsules in a full color system are adjusted to provide satisfactory color balance. In conjunction with this, the relative amounts of the microcapsules in the coating composition can be adjusted to improve color balance.

In addition to the photosensitive composition, the internal phase may additionally include a diluent oil. Inclusion of the oil often improves mid tone gradation in visual images. Preferred diluent oils are weakly polar solvents having boiling points above 170° C. and preferably in the range of 180° to 300° C. Examples of carrier oils are alkylated biphenyls (e.g., monoisopropylbiphenyl), polychlorinated biphenyls, castor oil, mineral oil, deodorized kerosene, naphthenic mineral oils, dibutyl phthalate, dibutyl fumerate, brominated paraffin and mixtures thereof. Alkylated biphenyls and kerosene are generally less toxic and preferred. The amount of diluent oil incorporated in the microcapsules will depend upon the photographic characteristics that are desired in the photosensitive materials. Typically, the diluent oil is used in an amount of approximately 10 to 20% by weight based on the weight of the internal phase.

The photosensitive microcapsules of the present invention can be formed using known encapsulation techniques. The photosensitive composition and associated agents can be encapsulated in hydrophilic wall-forming materials such as gelatin-type materials (see U.S. Pat. Nos. 2,730,456 and 2,800,457 to Green et al) including gum arabic, polyvinyl alcohol, carboxy-methyl-cellulose; resorcinol-formaldehyde wall formers (see U.S. Pat. No. 3,755,190 to Hart et al); isocyanate wall-formers (see U.S. Pat. No. 3,914,511 to Vassiliades); isocyanatepolyol wall-formers (see U.S. Pat. No. 3,796,669 to Kirintani et al); urea formaldehyde wall-formers, particularly urea-resorcinol-formaldehyde in which oleophilicity is enhanced by the addition of resorcinol (see U.S. Pat. Nos. 4,001,140; 4,087,376 and 4,089,802 to Foris et al); and melamine-formaldehyde resin and hydroxypropyl cellulose (see commonly assigned U.S. Pat. No. 4,025,455 to Shackle). Urea-formaldehyde microcapsules are preferred for use in the present invention. Methods for producing urea formaldehyde capsules which are particularly useful are described in U.S. Pat. Nos. 4,251,386 and 4,138,362.

The mean size of the microcapsules of the present invention generally ranges from approximately 1 to 25 microns. As a general rule, image resolution improves as capsule size decreases except that if the capsule size is too small, the capsules may disappear in the pore or fiber structure of some substrates.

The microcapsules of the present invention can be used to form either transfer or self-contained, monochromatic or full color imaging systems. A detailed description of transfer materials can be found in U.S. Pat. No. 4,399,209. Self contained systems are the subject of commonly assigned U.S. Pat. No. 4,440,846.

Illustrative examples of developers useful with electron donating type color precursors mentioned above are clay minerals such as acid clay, active clay, attapulgite, etc.; organic acids such as tannic acid, gallic acid, propyl gallate, etc.; acid polymers such as phenol-formaldehyde resins, phenol acetylene condensation resins, condensates between an organic carboxylic acid having at least one hydroxy group and formaldehyde, etc.; metal salts or aromatic carboxylic acids such as zinc salicylate, tin salicylate, zinc 2-hydroxy naphthoate, zinc 3,5 di-tert-butyl salicylate, zinc 3-cyclohexyl-5-($\alpha,\alpha$-dimethylbenzyl)salicylate (see U.S. Pat. Nos. 3,864,146 and 3,934,070), oil soluble metal salts or phenol-formaldehyde novolak resins (e.g., see U.S. Pat. Nos. 3,672,935; 3,732,120 and 3,737,410) such as zinc modified oil soluble phenol-formaldehyde resin as disclosed in U.S. Pat. No. 3,732,120, zinc carbonate etc. and mixtures thereof.

The most common substrate for the photosensitive material of this invention is paper. The paper may be a commercial impact raw stock, or a special grade paper such as cast-coated paper or chrome-rolled paper. Transparent substrates such as polyethylene terephthalate and translucent substrates can also be used in this invention.

Imaging sheets in accordance with the present invention can be exposed and developed by the imaging processes described in the aforementioned patents and applications which have been incorporated by reference. More specifically, images are formed by image-wise exposing the imaging sheets to actinic radiation and subjecting the microcapsules to a uniform rupturing force. Where the microcapsules include a chromogenic material in the internal phase (or the chromogenic material is otherwise associated with the microcapsules such that release of the internal phase from the microcapsules controls the image) the microcapsules are preferably ruptured in the presence of a developer material which is capable of reacting with the chromogenic material and forming a color image. In transfer systems, the developer is present on a separate sheet whereas in self-contained systems it is present on the imaging sheet itself in the same layer as the microcapsules or in a separate contiguous layer. In accordance with a specific embodiment of the invention, images are formed on self-contained imaging sheets by image-wise exposing them to actinic radiation and subjecting the sheet to a uniform rupturing force. Then, following development, the sheet is uniformly exposed to ultraviolet radiation (e.g., fluorescent lighting) whereupon the sensitizer is bleached and an image having a brighter, whiter background is obtained. Alternatively, after the microcapsules are ruptured, developer can be applied to the imaging sheet such as by dusting the sheet with a dry developer composition.

In accordance with the present invention, microcapsules can be ruptured by passing the imaging sheet (in combination with a developer sheet in the case of a transfer system) through the nip between two pressure rollers. Alternatively, other means such as ultrasonic vibration, solvent vapor exposure, or peeling development can be used. Another means useful in developing the imaging sheets is by means of a so-called burnishing roller as described in U.S. Pat. No. 4,448,516.

The present invention is illustrated in more detail by the following non-limiting examples:

EXAMPLES

The photosensitive microcapsule formulations described in this application were prepared using the encapsulation procedure set forth below. This technique consists of dispersion of the aqueous insoluble internal phase into an aqueous external phase, followed by addition of capsule wall forming materials to the prepared emulsion. The external phase components, including the encapsulation materials, are identical for the four examples given and are:

| | |
|---|---|
| 104.0 g - | Distilled $H_2O$ |
| 3.1 g - | Pectin (grade 1, citrus) |
| 24.8 g - | 18.5% (W/W) Aqueous base hydrolyzed Isobam |
| 0.1 g - | Quadrol (an adduct of propylene oxide and ethylenediamine) |
| 16.6 g - | 50% (W/W) Aqueous urea |
| 5.8 g - | 13.8% (W/W) Aqueous resorcinol |
| 21.4 g - | 37% (W/W) Aqueous formaldehyde |
| 10.6 g - | 5.66% (W/W) Aqueous ammonium sulfate |
| 2.8 g - | Sodium bisulfite |

The internal phase compositions of the four examples given are identical except for the specific initiator. The invariant components are as follows:

| | |
|---|---|
| 50.0 g - | Trimethylolpropane triacrylate (TMPTA) |
| 2.0 g - | Ethyl,4-dimethylaminobenzoate (Quanticure EPD) |
| 3.0 g - | 1,1-Bis(4-dimethyaminophenyl)-5-dimethylamino-3-oxophthalan |
| 1.67 g - | Trifunctional isocyanate adduct of trimethylolpropane and 2,4 toluene diisocyanate (SF-50) |
| 3.33 g - | Trifunctional trimer of 1,6-hexanediisocyanate (N-100) |

The examples varied by the inclusion in the internal phase of the photoinitiators indicated below:

Example 1

0.23 g—7-Diethylamino-3-thenoylcoumarin

Example 2

0.10 g—7-Diethylamino-3-cinnamoylcoumarin

Example 3

0.50 g—9,10-Phenanthrenequinone

Example 4

10.0 g—9-Fluorenone

Procedure

A 600 ml stainless steel beaker equipped with a Servodyne overhead stirrer fitted with a six-bladed, 45° pitch turbine impeller and positioned upon a variable temperature hotplate was charged with the water and Isobam components of the external phase mixture. To this stirred mixture was added, by continuous slow sifting, the pectin component. After approximately twenty minutes of stirring the mixture appeared homogeneous and the pH was adjusted to 4.0 by dropwise addition of 20% (W/W) aqueous sulfuric acid. At this time the Quadrol was added in one portion. The stirring speed was adjusted to 3000 RPM and the specific internal phase solution (Examples 1 through 4), prepared by sequential addition of the other internal phase components, excepting the trifunctional isocyanate oligomers, to TMPTA with vigorous stirring and heating to 80° C., followed by addition and mixing of the isocyanates 1 to 2 minutes prior to use, was added in a thin continuous stream over a 10 to 15 second period. After a 10-minute emulsification period the stirrer speed was reduced to 2000 RPM and the aqueous solutions of urea, resorcinol, formaldehyde and ammonium sulfate were added, in the stated order, at 2-minute intervals. Subsequently, the encapsulation mixture was heated to 65° C. using in combination the hotplate and an impinging blast of hot air. Upon reaching 65° C., this temperature was maintained with the hotplate alone. After a 2-hour curing period, the encapsulation mixture was allowed to cool and the pH was adjusted to 9.0 by dropwise addition of 20% (W/W) aqueous sodium hydroxide. Addition of sodium bisulfite completed the encapsulation.

The individual microcapsule batches were diluted to 22% total solids with 2.5% (W/W) aqueous Klucel L and coated on 80 lb Black and White Glossy (The Mead Corporation) paper using a number 12 wire-wound rod. The samples were allowed to age overnight, placed in a 90° C. forced air oven for 1 hour and allowed to cool to room temperature before evaluation.

Test exposures of each coated example were made through a Stauffer step tablet (0.10 density increments) in contact with the photosensitive layer. The exposure times were 64 seconds for all samples evaluated. A uniform flux of light was provided by a closely spaced planar array of four 15 watt cool white fluorescent bulbs centered parallel to and at a distance 6 inches from the photosensitive surface. Each test sample was pressure calendered active surface to active surface against an acidic developer sheet and the resultant image densities were measured using a Macbeth TR927 Densitometer. The results of the evaluations are shown in Table 1.

As can be seen from this data, Examples 1 and 2, which contain 3-ketocoumarin compounds, are clearly superior initiators as compared with the sensitizers used in Examples 3 and 4.

TABLE 1

| Example | Step Number | |
|---|---|---|
| | D90 | D10 |
| 1 | 19.5 | 16.7 |
| 2 | 21.5 | 17.7 |
| 3 | 6.9 | 3.3 |
| 4 | 8.2 | 4.7 |

Reference Example

To illustrate the photobleachable character of various sensitizers useful in the present invention, microcapsules prepared as in Examples 1-4 above but containing the sensitizers shown in Table 2 were coated on a sheet of white frosted glass. Through this support, the photoactive surfaces of the samples were exposed to light from two 40 watt cool white fluorescent bulbs at a distance of 2½ inches. The densities of the initial yellow shades as well as the bleached densities were measured with a Macbeth Model TR 924 densitometer using the blue filter setting. The minimum achievable density was assumed to be equal to the density of the substrate paper, which was typically in the range of 0.08 to 0.09 density units. The microcapsule batches were not image-wise exposed or developed prior to the fading study. Density of the samples was measured immediately before fading exposure, at 5 minute intervals up to 25 minutes, and at 90, 180, and 300 minutes total cumulative exposure. As can be seen from these data listed in Table 3, all of the samples bleached significantly, many within 5 minutes total exposure.

TABLE 2

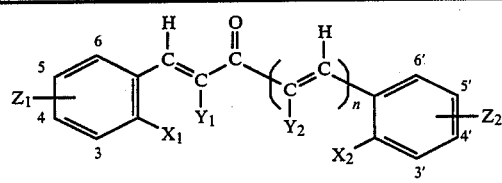

| Sensitizer | $Z_1$ | $X_1, Y_1$ | $X_2, Y_2$ | n | $Z_2$ |
|---|---|---|---|---|---|
| 1 | 4-N(CH$_3$)$_2$ | —O—C=O | — | 0 | — |
| 2 | 4-N(C$_2$H$_5$)$_2$ | " | —O—C=O | 1 | 4'-N(C$_2$H$_5$)$_2$ |
| 3 | 4-OCH$_3$ | " | " | " | 4'-OCH$_3$ |
| 4 | 4-N(C$_2$H$_5$)$_2$ | " | " | " | 4',6'(—OCH$_3$)$_2$ |
| 5 | " | " | " | " | 4'-OCH$_3$ |
| 6 | " | " | " | " | — |
| 7 | " | " | —O— | " | — |
| 8 | " | " | H,H | " | — |
| 9 | " | " | " | 2 | — (Impure Cmpd) |
| 10 | " | " | " | " | — |
| 11 | " | " | " | 1 | 4'-N(CH$_3$)$_2$ |
| 12 | " | " | " | " | 3'-Cl |
| 13 | " | " | " | " | 4'-Cl |
| 14 | " | " | " | " | 5',6'CH=CH—CH=CH— |
| 15 | " | " | " | " | 4',5'-CH=CH—CH=CH— |
| 16 | 4-N(CH$_3$)$_2$ | H,H | H,H | " | 4'-N(CH$_3$)$_2$ |
| 17 | " | " | — | 0 | " |

390 nm to 500 nm Sensitizers

TABLE 2-continued
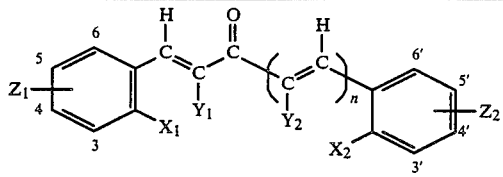
18
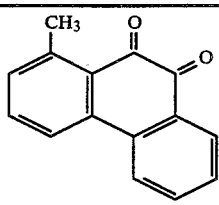
19
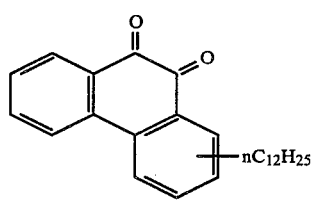
20
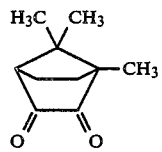
21
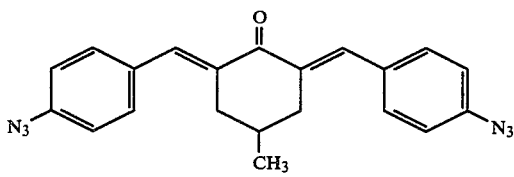
22
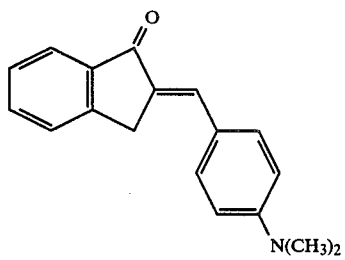
TABLE 3
390 nm to 500 nm Sensitizer Photobleachable Data
| Sensitizer No. | Exposure Time (minutes) | | | | | | |
|---|---|---|---|---|---|---|---|
| | 0 | 5 | 10 | 25 | 90 | 180 | 300 |
| 1 | 0.14 | 0.12 | 0.13 | 0.13 | 0.11 | 0.11 | 0.11 |
| 2 | 0.32 | 0.21 | 0.21 | 0.17 | 0.15 | 0.13 | 0.12 |
| 3 | 0.31 | 0.17 | 0.17 | 0.16 | 0.14 | 0.13 | 0.12 |
| 4 | 0.24 | 0.14 | 0.16 | 0.14 | 0.13 | 0.11 | 0.10 |
| 5 | 0.58 | 0.39 | 0.37 | 0.31 | 0.25 | 0.22 | 0.18 |
| 6 | 0.34 | 0.26 | 0.24 | 0.22 | 0.20 | 0.19 | 0.18 |
| 7 | 0.43 | 0.32 | 0.30 | 0.22 | 0.18 | 0.16 | 0.13 |
| 8 | 0.44 | 0.24 | 0.23 | 0.22 | 0.18 | 0.17 | 0.17 |
|   | 0.24 | 0.13 | 0.12 | 0.11 | 0.11 | 0.11 | 0.12 |
|   | 0.29 | 0.18 | 0.18 | 0.17 | 0.16 | 0.15 | 0.15 |
| 9 | 0.28 | 0.16 | 0.13 | 0.12 | 0.11 | 0.10 | 0.09 |
| 10 | 0.33 | 0.18 | 0.18 | 0.15 | 0.14 | 0.12 | 0.11 |
| 11 | 0.95 | 0.42 | 0.28 | 0.25 | 0.20 | 0.16 | 0.13 |
| 12 | 0.38 | 0.15 | 0.15 | 0.11 | 0.11 | 0.09 | 0.09 |
| 13 | 0.31 | 0.12 | 0.11 | 0.10 | 0.10 | 0.09 | 0.09 |
| 14 | 0.25 | 0.16 | 0.14 | 0.14 | 0.13 | 0.11 | 0.11 |
| 15 | 0.51 | 0.25 | 0.24 | 0.23 | 0.21 | 0.16 | 0.14 |
| 16 | 0.76 | 0.73 | 0.62 | 0.44 | 0.33 | 0.30 | 0.28 |
| 17 | 0.26 | 0.17 | 0.15 | 0.15 | 0.14 | 0.14 | 0.15 |
|    | 0.48 | 0.44 | 0.38 | 0.31 | 0.28 | 0.28 | 0.28 |
| 18 | 0.18 | 0.13 | 0.12 | 0.12 | 0.13 | 0.13 | 0.12 |
|    | 0.20 | 0.17 | 0.17 | 0.17 | 0.17 | 0.18 | 0.19 |
|    | 0.16 | 0.12 | 0.12 | 0.12 | 0.12 | 0.12 | 0.12 |
| 19 | 0.21 | 0.17 | 0.17 | 0.17 | 0.16 | 0.14 | 0.15 |
| 20 | 0.75 | 0.55 | 0.40 | 0.30 | 0.21 | 0.17 | 0.17 |
| 21 | 0.61 | 0.59 | 0.60 | 0.59 | 0.53 | 0.53 | 0.45 |
|    | 0.58 | 0.60 | 0.60 | 0.57 | 0.48 | 0.38 | 0.30 |
| 22 | 0.24 | 0.25 | 0.25 | 0.25 | 0.18 | 0.12 | 0.12 |
Having described the invention in detail and by reference to preferred embodiments thereof, it will be appar-

What is claimed is:

1. An imaging sheet useful in forming full color images comprising a support having on a surface thereof a layer containing three sets of microcapsules having distinct sensitivities and containing respectively cyan, magenta, and yellow image-forming agents; one of said three sets of microcapsules being blue light-sensitive and including in the internal phase thereof a free radical addition polymerizable material and a photoinitiator system including a photobleachable sensitizer, said sensitizer being bleachable upon exposure to radiation in the wavelength range of 390 to 500 nm and being represented by formula (I):

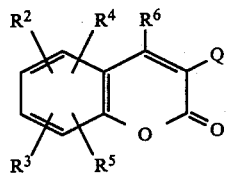 (I)

wherein Q is $-Z-R^1$, Z is carbonyl, $R_1$ is a hydroxyl group, an alkenyl group, an alkoxy group, an alkyl group, an aryl group, a carboxyclic group or a heterocyclic group;

$R^2$, $R^3$, $R^4$ and $R^5$ each independently represent hydrogen, an alkoxy group, a dialkylamino group, a halogen atom, an acyloxy group, a nitro group, a 5- or 6-membered heterocyclic group, or a group having the formula (II):

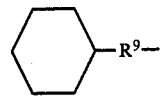 (II)

wherein $R^9$ is an alkylene group;
$R^6$ is hydrogen, an alkyl group or an aryl group;
and wherein two or three of $R^2$, $R^3$, $R^4$ and $R^5$ and the nuclear carbon atoms to which they are attached can together form a fused ring or fused ring system, each ring being a 5- or 6-membered ring.

2. The imaging sheet of claim 1 wherein said microcapsule has a discrete capsule wall.

3. The imaging sheet of claim 2 wherein said free radical addition polymerizable material is an ethylenically unsaturated compound.

4. The imaging sheet of claim 3 wherein said sensitizer is substituted at the 7-position by a dialkylamino group.

5. The imaging sheet of claim 4 wherein $R^1$ is selected from the group consisting of an alkenyl group, a thienyl group, or a cinnamoyl group.

6. The imaging sheet of claim 5 wherein said photoinitiator system additionally includes an N,N-dialkylaniline compound as a hydrogen donor.

7. The imaging sheet of claim 6 wherein said imaging sheet additionally includes a developer material co-deposited with said microcapsules on the surface thereof, said developer being capable of reacting with said image-forming agent and forming a visible image.

8. The imaging sheet of claim 1 wherein said sensitizer is selected from the group consisting of
7-diethylamine-5',7'-dimethoxy-3,3'-carbonylbiscoumarin;
3,3'-carbonylbis(5,7-dimethoxycoumarin);
7-diethylamino-3,3'-carbonylbiscoumarin;
7-diethylamino-7'-methoxy-3,3'-carbonylbiscoumarin;
7-diethylamino-7'-dimethylamino-3,3'-carbonylbiscoumarin;
7-diethylamino-3-thenoylcoumarin;
3-(2-coumariloyl)-7-diethylaminocoumarin;
3-cinnamoyl-7-diethylaminocoumarin; and
3[(4-dimethylamino)-cinnamoyl-7-diethylaminocoumarin.

* * * * *